United States Patent
Ye et al.

(10) Patent No.: US 9,087,951 B2
(45) Date of Patent: Jul. 21, 2015

(54) METHOD AND APPARATUS FOR DIFFUSION INTO SEMICONDUCTOR MATERIALS

(71) Applicants: Jinlin Ye, Eastvale, CA (US); Shirong Liao, Eastvale, CA (US); Bo Liao, Chongqing (CN); Jie Dong, Chongqing (CN)

(72) Inventors: Jinlin Ye, Eastvale, CA (US); Shirong Liao, Eastvale, CA (US); Bo Liao, Chongqing (CN); Jie Dong, Chongqing (CN)

(*) Notice: Subject to any disclaimer, the term of this patent is extended or adjusted under 35 U.S.C. 154(b) by 0 days.

(21) Appl. No.: 13/630,440

(22) Filed: Sep. 28, 2012

(65) Prior Publication Data
US 2014/0093996 A1    Apr. 3, 2014

(51) Int. Cl.
*H01L 21/22*    (2006.01)
*H01L 31/107*   (2006.01)
*H01L 31/18*    (2006.01)
*H01L 21/223*   (2006.01)

(52) U.S. Cl.
CPC .......... *H01L 31/107* (2013.01); *H01L 31/1804* (2013.01); *H01L 31/184* (2013.01); *H01L 21/223* (2013.01); *H01L 21/2233* (2013.01); *Y02E 10/544* (2013.01); *Y02E 10/547* (2013.01)

(58) Field of Classification Search
USPC ............ 438/565, 45, 542; 257/E21.16, 257/E21.169; 117/84, 92, 95, 100, 108, 109
See application file for complete search history.

(56) References Cited

U.S. PATENT DOCUMENTS

| | | | | |
|---|---|---|---|---|
| 6,114,216 | A * | 9/2000 | Yieh et al. | 438/424 |
| 6,255,775 | B1 * | 7/2001 | Ikuko et al. | 313/506 |
| 6,624,441 | B2 * | 9/2003 | Cantwell et al. | 257/43 |
| 7,176,054 | B2 * | 2/2007 | Nause et al. | 438/104 |
| 2006/0121683 | A1 * | 6/2006 | Francis et al. | 438/380 |
| 2009/0279179 | A1 * | 11/2009 | Tanaka | 359/619 |
| 2011/0155049 | A1 * | 6/2011 | Solomon et al. | 117/99 |
| 2012/0189828 | A1 * | 7/2012 | Inomata et al. | 428/206 |

* cited by examiner

*Primary Examiner* — Julia Slutsker
(74) *Attorney, Agent, or Firm* — Che-Yung Chen; Law Office of Michael Chen

(57) ABSTRACT

A method and apparatus to manage the diffusion process by controlling the diffusion path in the semiconductor fabrication process is disclosed. In one embodiment, a method for processing a substrate comprising steps of forming one or more diffusion areas on said substrate; disposing the substrate in a diffusion chamber, wherein the diffusion chamber is under a vacuum condition and a source material therein is heated and evaporated; and diffusing the source material into the diffusion area on said substrate, wherein said source material travels through a diffusion controlling unit adapted to manage the flux thereof in the diffusion chamber, so concentration of the source material is uniform in a diffusion region above the substrate.

14 Claims, 8 Drawing Sheets

METHOD AND APPARATUS FOR DIFFUSION INTO SEMICONDUCTOR MATERIALS

FIELD OF THE INVENTION

The present invention relates to a method and apparatus for diffusion into semiconductor materials, and more particularly to a method and apparatus to manage the diffusion process by controlling the diffusion path in the semiconductor fabrication process.

BACKGROUND OF THE INVENTION

Over the past few decades, semiconductor devices have become important elements in electronic industries due to their miniaturization, lightweight, multi-functional and other characteristics. Modern electronic industries may require semiconductor devices with more specialized functions, such as semiconductor-based transistors, solar cells, light-emitting diode (LED), silicon controlled rectifier, photodiodes, and digital and analog integrated circuits.

Photodiodes have been utilized in the areas including military, optical communication, information technology and energy. Photodiodes are operated by absorbing photons or charged particles to generate a flow of current in an external circuit, proportional to the incident power. An avalanche photodiode (APD) is a special type of photodiode, where incoming photons trigger an internal charge avalanche in APDs to generate an internal current gain effect (around 100) due to this avalanche effect. For producing optoelectronic devices such as photodiodes, a vapor phase diffusion process is often used to diffuse dopants into InP or InGaAsP wafers to create p-n junctions or local areas of high electron/hole concentration. More specifically, a zone of semiconductor material containing an excess of acceptor impurities resulting in a deficit of electrons or an excess of "holes" is said to exhibit P-type activity, while a zone containing an excess of donor impurities and yielding an excess of free electrons is said to exhibit N-type activity.

Dopants are generally implanted in two ways. In some processes, dopants may be implanted on the surface of a substrate and then heat treated to cause them to diffuse into the substrate. In other processes, dopants may be ionized into a plasma and then driven energetically into the substrate using an electric field. The substrate is then heat treated to normalize distribution of dopants and repair disruption to the crystal structure caused by ions barreling through at high speed. In both type of processes, the heat treatment anneals the substrate, encouraging dopant and ambient atoms located at interstitial positions in the crystal to move to lattice points. However, high energy implantation may drive ions to a deep portion of the substrate, but will generally not achieve conformal implantation and may result in over-implantation.

When the doping is carried out by thermal diffusion, a well-controlled diffusion process is necessary so that the physical and electrical properties of the diffusion layer have good controllability and reproducibility, and a large area of wafers can be diffused simultaneously. The well-control diffusion process may require good control of the source of doping materials to achieve conformal implantation and isolation from contaminants that can disrupt the diffusion process or adversely affect material quality.

U.S. Pat. No. 5,049,524 to Kuo et al. discloses a process for diffusing Cd into an InP substrate, which enables the use of a scaled-up sealed tube. The process uses simple apparatus and can diffuse a large number of wafers or a large surface area of wafers in a run, and thus meet the requirements for mass production and economic benefits, as shown in FIG. 1. However, in addition to heating a diffusion furnace to obtain a constant diffusion temperature zone, Kuo uses red P together with $Cd_3P_2$ to quickly increase the vapor pressure of phosphorous in the tube chamber to the saturated phosphorus pressure under the diffusion temperature to inhibit the evaporation of phosphorus molecules from wafer surface to further prevent thermal damages and ensure good controllability and reproducibility of diffusion. However, Kuo does not disclose any diffusion control means from the diffusion source to the wafers to achieve conformal deposition. Also, Kuo's diffusion control method may be limited to this specific manufacturing process.

U.S. Pat. No. 6,302,962 to Nam et al. discloses a diffusion system for manufacturing semiconductor devices has an air curtain formed across a furnace opening for preventing the loss of heat energy from inside the furnace, as shown in FIG. 2. The diffusion system maintains a uniform inner temperature inside a furnace, which improves the uniformity of the layers formed on a semiconductor substrate, increases the endurance of the furnace, and reduces the time for the temperature recovery, thereby improving the production yield of semiconductor devices. In other words, Nam uses the air curtain to compensate for the loss of the heated air flow and raise the inner temperature around the opening during the diffusion process to prevent the formation of non-uniform thickness layers formed on the semiconductor substrate. However, Nam focuses on improving thin film uniformity by controlling the temperature of the diffusion process, instead of controlling the diffusion path from the diffusion source to the wafers.

U.S. Pat. No. 7,964,435 to Ben-Michael et al. discloses a method for controlling dopant diffusion in a semiconductor manufacturing process. Ben-Michael controls certain parameters that are not used in the prior arts to control the diffusion process. For example, the size of a diffusion window (e.g. 310, 320) of a mask can be used to control diffusion depth. Also, the size of the diffusion window can be used in conjunction with other process variables, such as dopant concentration and ambient temperature, to provide a specific diffusion depth, as shown in FIG. 3. Likewise, Ben-Michael does not disclose or discuss the parameter of diffusion path from the diffusion source to the wafers and how to uniformly diffuse the material to the substrate. Therefore, there remains a need for a new and improved method and system to more effectively control the diffusion process.

SUMMARY OF THE INVENTION

It is an object of the present invention to provide an apparatus and method to effectively control the diffusion process to achieve conformal deposition on a substrate.

It is another object of the present invention to provide an apparatus and method having a diffusion controlling unit with a plurality of diffusion paths to enhance uniformity of the concentration in a diffusion region above the substrate.

It is still another object of the present invention to provide an apparatus and method to enhance throughput in the semiconductor manufacturing process.

It is a further object of the present invention to provide an apparatus and method having a diffusion controlling unit to control the diffusion flux in semiconductor manufacturing process.

In one aspect, a diffusion chamber used in semiconductor manufacturing process may include a source material; a substrate attached to a susceptor, wherein said substrate has one or more diffusion areas that are doped by the source material;

and a diffusion controlling unit, wherein said diffusion chamber is under a vacuum condition where the source material is heated and evaporated, and travels through the diffusion controlling unit adapted to manage the flux of the source material, so concentration of the source material is uniform in a diffusion region above the substrate.

In one embodiment, the diffusion controlling unit comprises a plurality of diffusion paths, and the size of an opening of the diffusion path ranges from a few micrometers to a few hundred nanometers, and the length between the opening to the substrate ranges from millimeters to centimeters. Under the circumstances, some source material may be blocked by the diffusion controlling unit, while some source material can pass through the diffusion paths to form the diffusion region with uniform concentration of the source material.

In another aspect, a method for diffusing impurities into a semiconductor substrate in a diffusion chamber that has a diffusion controlling unit, may include steps of forming one or more diffusion areas on said semiconductor substrate; disposing the semiconductor substrate in the diffusion chamber, wherein the diffusion chamber is under a vacuum condition and the impurities therein are heated and evaporated; and diffusing the impurities into the diffusion area on said semiconductor substrate, wherein said impurities travel through the diffusion controlling unit adapted to manage the flux thereof, in the diffusion chamber, so concentration of the impurities is uniform in a diffusion region above the semiconductor substrate.

In one embodiment, the diffusion controlling unit comprises a plurality of diffusion paths, and the size of an opening of the diffusion path ranges from a few micrometers to a few hundred nanometers, and the length between the opening to the substrate ranges from millimeters to centimeters. In another embodiment, more than one substrate is allowed to be disposed in the diffusion chamber to increase the throughput.

BRIEF DESCRIPTION OF THE DRAWINGS

FIG. 5b illustrates another embodiment of FIG. 5a.

DETAILED DESCRIPTION OF THE INVENTION

Figure 1:
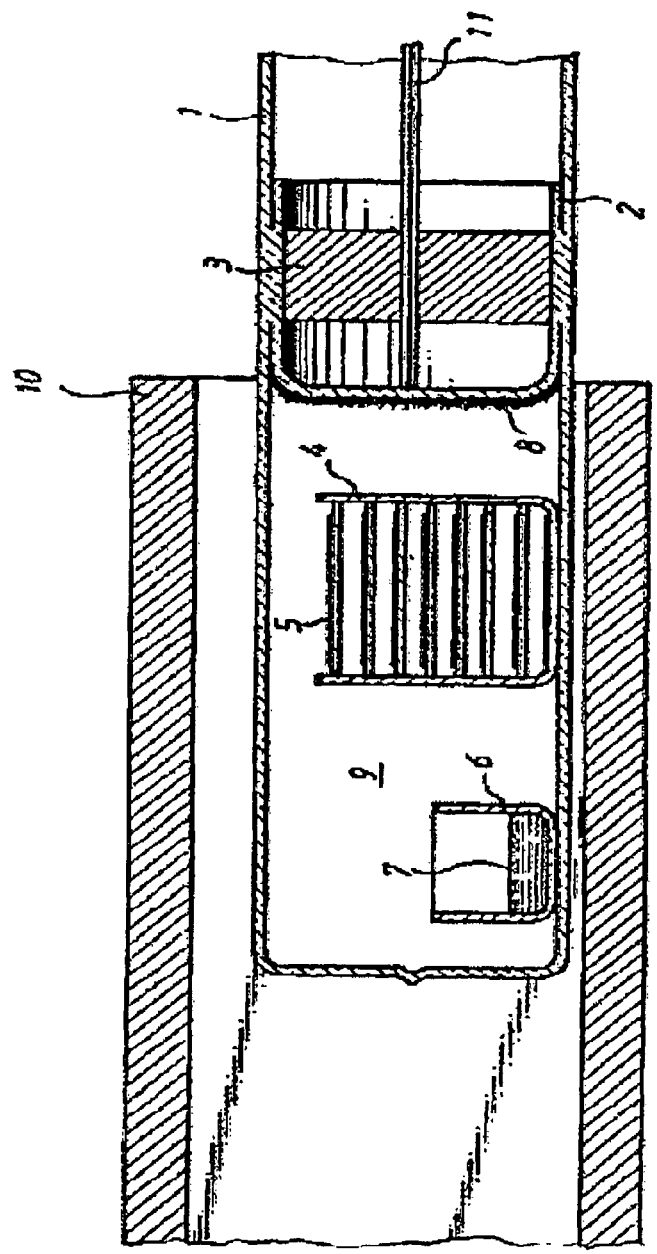
FIG. 1 illustrates a prior art disclosing a process for diffusing Cd into an InP substrate, which enables the use of a scaled-up sealed tube.
Figure 2:
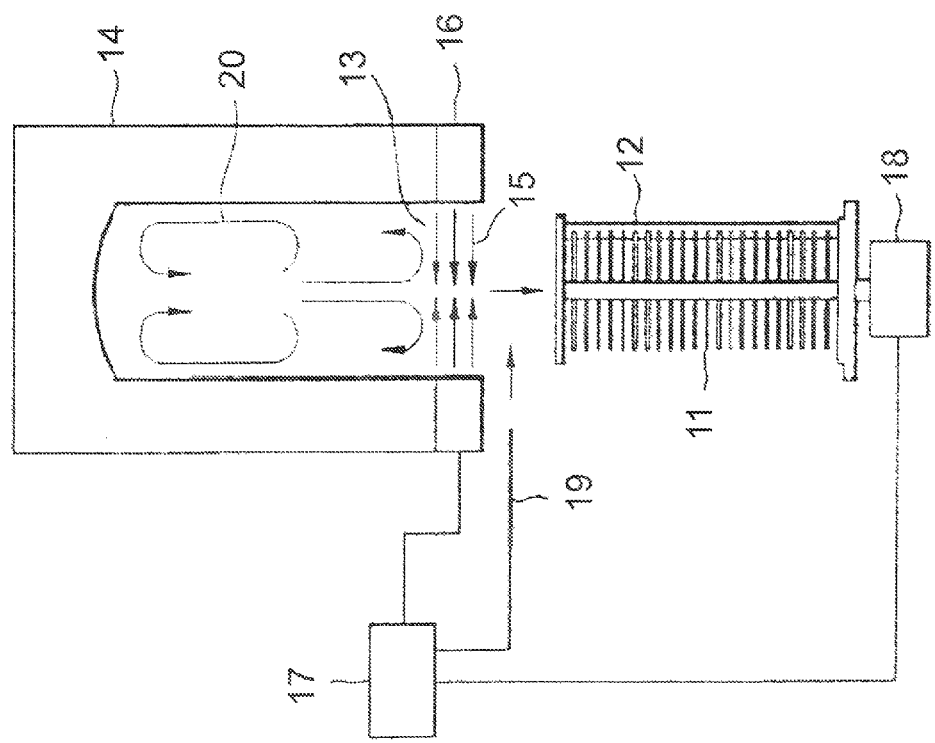
FIG. 2 illustrates a prior art disclosing a diffusion system for manufacturing semiconductor devices has an air curtain formed across a furnace opening for preventing the loss of heat energy from inside the furnace.
Figure 3:
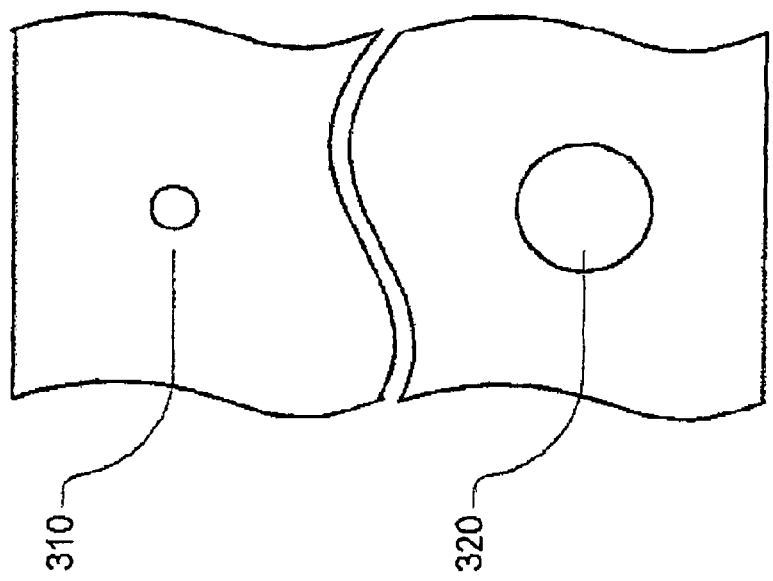
FIG. 3 illustrates a prior art disclosing a method for controlling dopant diffusion in a semiconductor manufacturing process.

The detailed description set forth below is intended as a description of the presently exemplary device provided in accordance with aspects of the present invention and is not intended to represent the only forms in which the present invention may be prepared or utilized. It is to be understood, rather, that the same or equivalent functions and components may be accomplished by different embodiments that are also intended to be encompassed within the spirit and scope of the invention.

Unless defined otherwise, all technical and scientific terms used herein have the same meaning as commonly understood to one of ordinary skill in the art to which this invention belongs. Although any methods, devices and materials similar or equivalent to those described can be used in the practice or testing of the invention, the exemplary methods, devices and materials are now described.

All publications mentioned are incorporated by reference for the purpose of describing and disclosing, for example, the designs and methodologies that are described in the publications that might be used in connection with the presently described invention. The publications listed or discussed above, below and throughout the text are provided solely for their disclosure prior to the filing date of the present application. Nothing herein is to be construed as an admission that the inventors are not entitled to antedate such disclosure by virtue of prior invention.

As stated above, in the semiconductor manufacturing process, doping is often necessary to impart impurities into a pure material to create p-n junctions or local areas of high electron/hole concentration to produce optoelectronic devices, for example. While high energy implantation may drive ions to a deeper portion of the substrate, it will not generally achieve conformal implantation and may cause over-implantation. When the doping is carried out by thermal diffusion, a well-controlled diffusion process is necessary so that the physical and electrical properties of the diffusion layer have good controllability and reproducibility, and a large area of wafers can be diffused simultaneously. The well-control diffusion process may require good control of the source of doping materials and isolation from contaminants that can disrupt the diffusion process or adversely affect material quality.

Diffusion is the movement of a species from an area of high concentration to an area of lower concentration. As mentioned above, the controlled diffusion of dopants into semiconductors (e.g. silicon) to alter the type and level of conductivity of semiconductor materials is the foundation of forming a p-n junction and fabrication of devices during wafer fabrication. The mathematics that governs the diffusion phenomena is based on Fick's Laws.

According to Fick's First Law, when an impurity concentration gradient $\partial C/\partial x$ exists in a finite volume of a matrix substance (e.g. silicon substrate), the impurity material has a natural tendency to move in order to distribute itself in a more even manner within the matrix and decrease the gradient. Given enough time, the flow of impurities will eventually result in homogeneity within the matrix, causing the net flow of impurity to stop. In 1885, Fick postulated that the flux of material across a given plane is proportional to the concentration of gradient across the plane, which is so called Fick's First Law:

$$J = -D\frac{\partial C(x, t)}{\partial x}$$

where J is the flux, D is the diffusion coefficient for the diffusing material, and $\partial C(x,t)/\partial x$ is the concentration gradient. The negative sign in the equation indicates that the impurities are moving to the direction of lower concentration.

However, Fick's First Law may not adequately describe the diffusion process since the concentration gradient of an impurity in a finite volume decreases with time, and Fick's Second Law further modifies Fick's First Law to state that the change in impurity concentration over time is equal to the change in local diffusion flux:

$$\frac{\partial C(x,t)}{\partial t} = -\frac{\partial J}{\partial x}$$

If the diffusion coefficient is independent of position, the Fick's Second Law can be further combined with the Fick's First Law:

$$\frac{\partial C(x,t)}{\partial t} = D\frac{\partial^2 C(x,t)}{\partial x^2}$$

Figure 4:
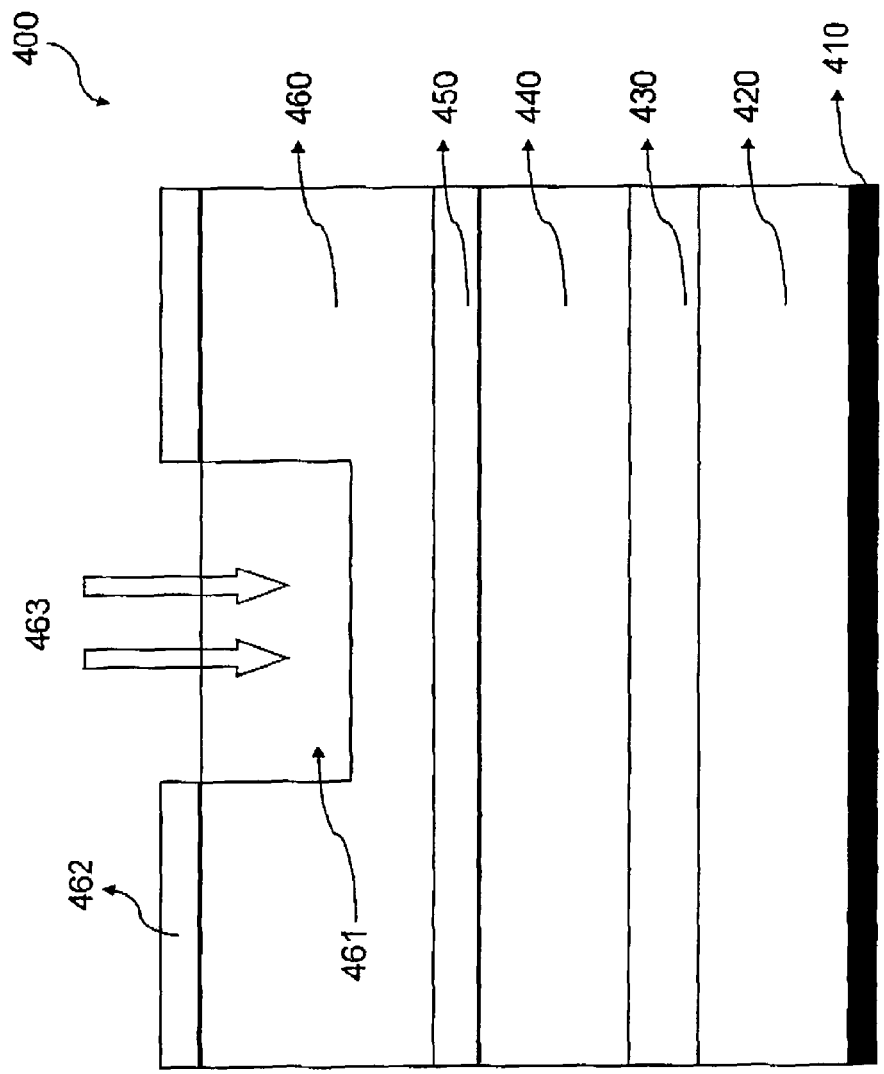
FIG. 4 illustrates an avalanche photodiode having a diffusion region that is being doped.

In one aspect, a high-speed photodiode 400 may include a substrate 420, a buffer layer 430, an absorbing layer 440, a charge layer 450, and an avalanche (or multiplication) layer 460 having a diffusion region 461. A bottom electrode 410 and a top electrode (not shown), which are oppositely charged, apply a voltage across the photodiode. The charge layer 450 helps moderate the electrical field, as shown in FIG. 4.

The avalanche layer 460 can be formed of a material including InP, InGaAs, etc. The avalanche layer 460 is where the electrons initially generated by the incident photons accelerate and multiply as they move through the active region of the photodiode 400. The diffusion region 461 may be formed at the center portion of the avalanche layer 460 with an implanted doping material, for example, Zinc, to form a p+ InP diffusion region 461. The position of a mask 462 is used to determine the diffusion area of the diffusion region 461, and the doping material is diffused into the diffusion region 461 through the direction 463. In one embodiment, the high-speed photodiode 400 is an avalanche photodiode (APD). In another embodiment, the high-speed photodiode 400 is a PIN diode.

Figure 5:
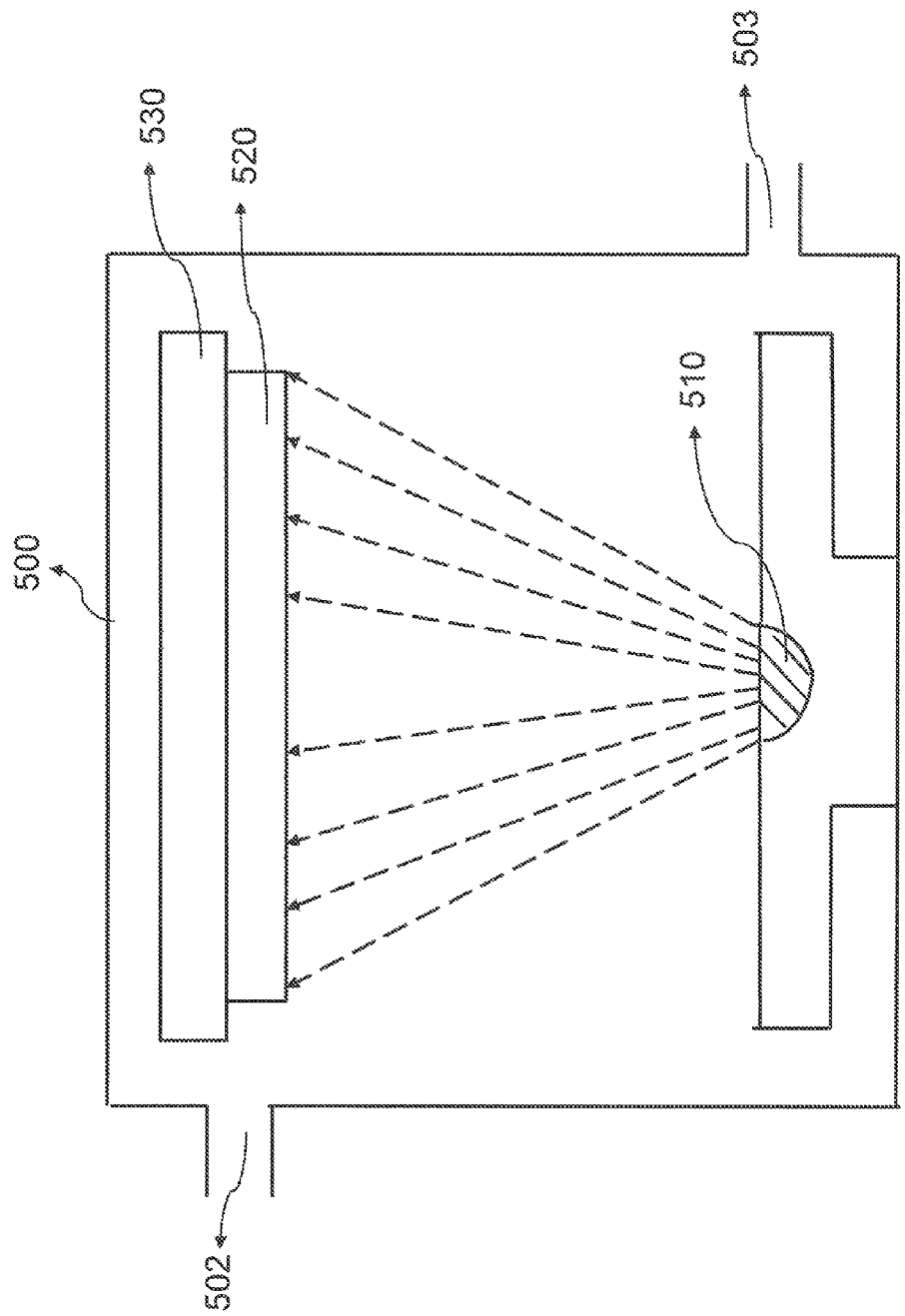
FIG. 5 illustrates a thermal diffusion system without a diffusion controlling unit.

A vapor phase diffusion process is often used to thermally diffuse materials into the diffuse region 461 of the photodiode 400. As shown in FIG. 5, a thermal diffusion chamber 500 may include a source 510 that can be evaporated when the source 500 is heated while the diffusion chamber 500 is under a vacuum condition, and the vapor particles would travel directly to a substrate 520 attached to a back plate 530. In one embodiment, the substrate 520 is the photodiode 400. The thermal diffusion chamber may include a pump end 502 connecting to a vacuum pump and a gas discharging end 503. Since the diffusion rate is relatively high (e.g. 0.05 μm/min for Zn at 500° C.) in conventional thermal diffusion processes, it is difficult to precisely control the concentration of the vapor particles that may affect quality of the diffusion process, such as diffusion depth, impurity concentration and uniformity of the deposition. In one embodiment, the diffusion source 500 includes Zinc Phosphide ($Zn_3P_2$) and Cadmium Phosphide ($Cd_3P_2$).

Figure 5A:
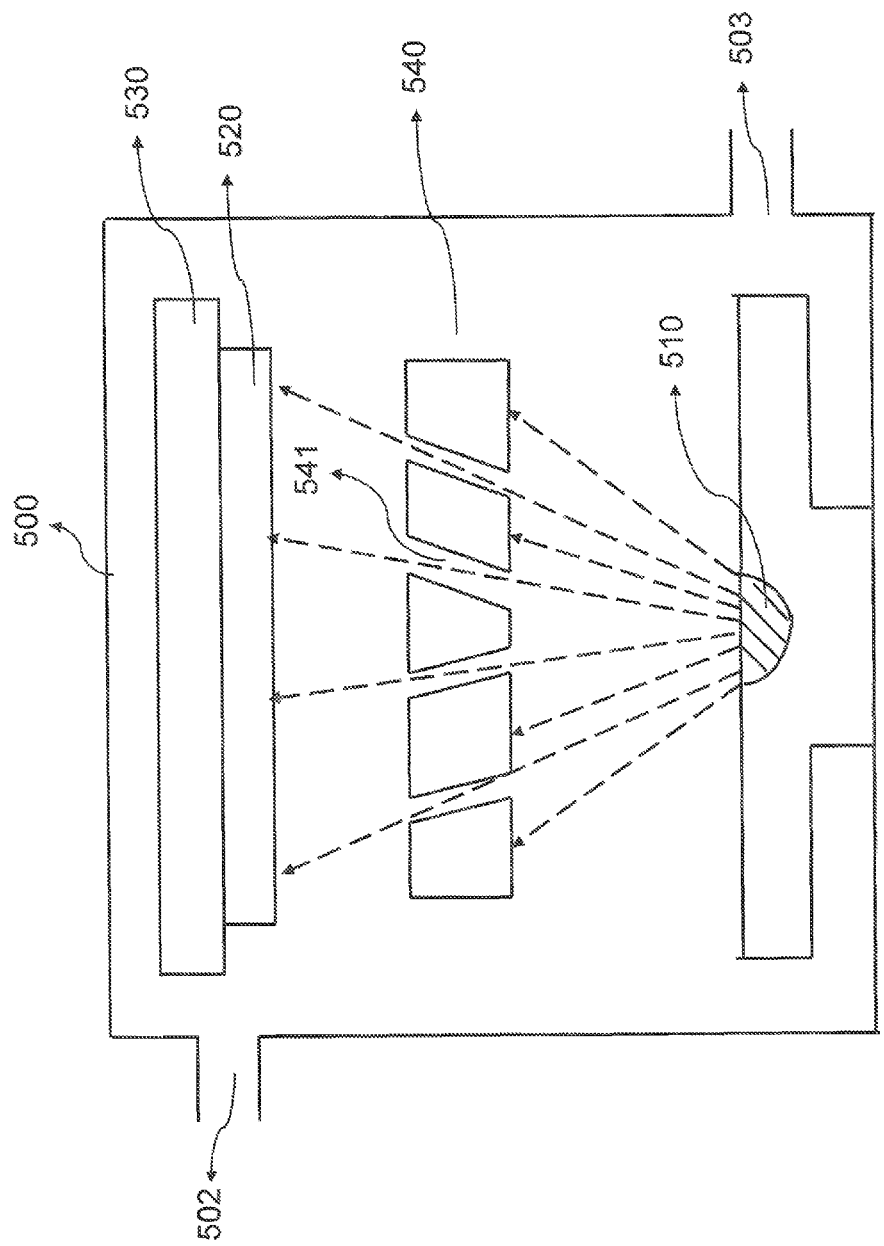
FIG. 5a illustrates a thermal evaporation apparatus with a diffusion controlling unit that has a plurality of diffusion paths.

In an exemplary embodiment, a diffusion controlling unit 540 having a plurality of diffusion paths 541 is introduced into the thermal diffusion chamber 500 between the substrate 520 and the source 510. As can be seen in FIG. 5a, the diffusion paths 541 are adapted to manage the flux of the vapor evaporated from the source 510. Different from the thermal diffusion system in FIG. 5, the vapor particles are regulated and screened by the diffusion paths 541 of the diffusion controlling unit 540, so some vapor particles may be blocked by the diffusion controlling unit 540 or do not go through, while some may travel through the diffusion paths 541 and form a diffusion region with uniform concentration (of the source material) before diffusing into the substrate 520. In some embodiments, the source material may be diffused into a predetermined region of the substrate 520 (such as the diffusion region 461 of the photodiode 400). The diffusion depth can be determined by Fick's Law of Diffusion as illustrated above. The size of the diffusion path 521 can be used to control the diffusion rate of the source material 510, wherein the size of the opening of the diffusion path 521 ranges from a few micrometers to a few hundred nanometers, and the distance between the opening to the substrate 520 ranges from millimeters to centimeters.

With the arrangement of the diffusion controlling unit 540 in the thermal diffusion chamber 500, the diffusion process can be well controlled. More particularly, the flux of the vapor particles can be regulated by the diffusion paths 541, so the vapor particles can be conformally arranged in the diffusion region above the substrate 520 before diffusing into the substrate 520. It is noted that through the control of the size of the diffusion path 541, the concentration and uniformity of the source material in the diffusion region above the substrate 520 can be further controlled. In a further embodiment, more than one substrate 520 can be simultaneously attached to the back plate 530 to increase the throughput of the diffusion process.

Figure 5B:
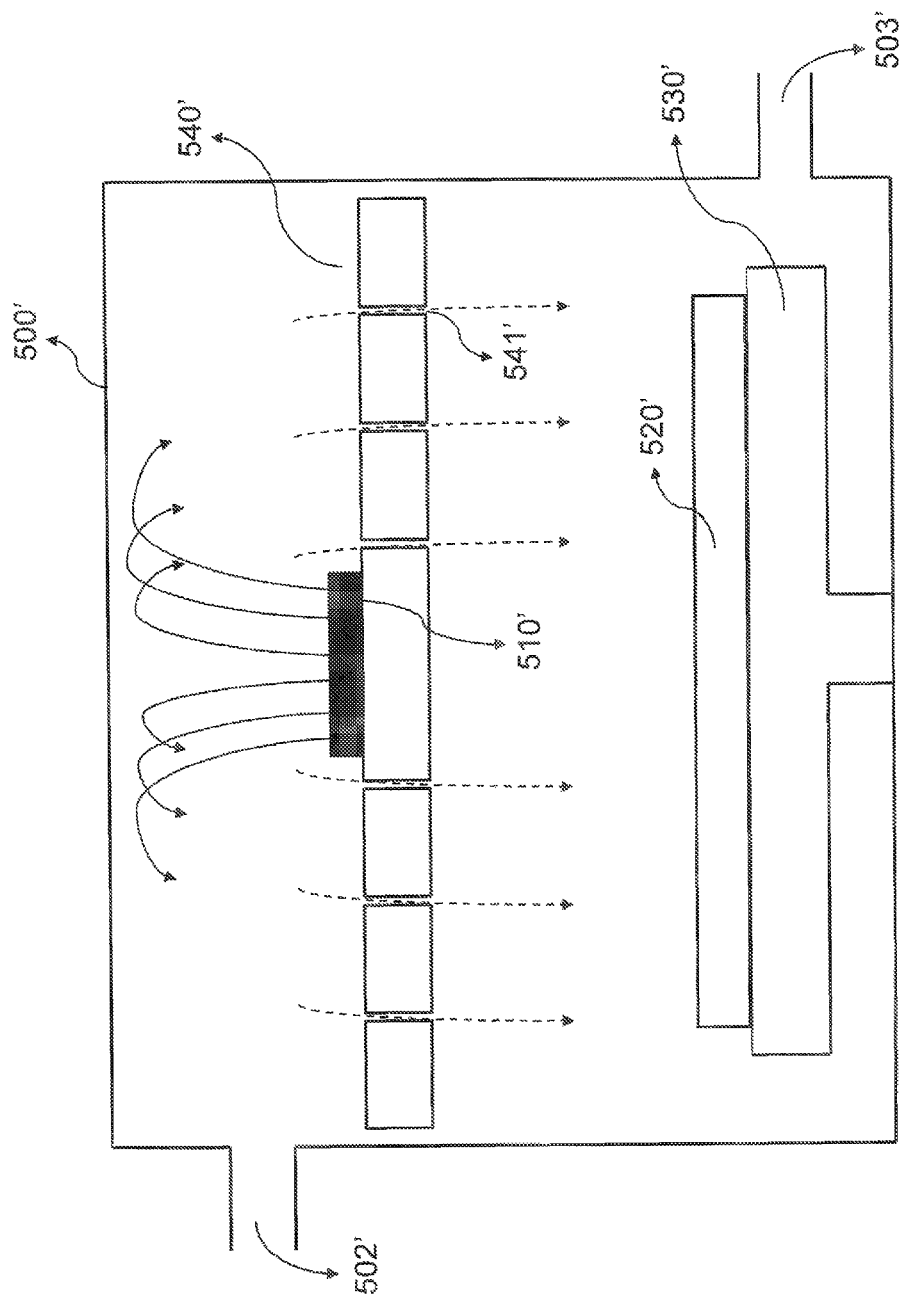

In still a further embodiment, a source 510' can be disposed at an upper portion of a thermal diffusion chamber 500' as shown in FIG. 5b, which may also include a substrate 520' attached to a susceptor 530 and a diffusion controlling unit 540' having a plurality of diffusion paths 541'. Like the thermal diffusion chamber 500 in FIG. 5a, the source 510' is heated and evaporated when the chamber is under a vacuum condition, and some vapor particles are blocked by the diffusion controlling unit 540', while some are traveling through the diffusion paths 541' to reach the surface of the substrate 520'. The flux of the vapor particles, like previous embodiments, are regulated by the diffusion paths 541', so the concentration of the vapor particles can be more uniform in the diffusion region above the substrate 520', and the uniformity of the diffusion region can be further managed to reach an atomic level. The substrate 520' can be a photodiode such as photodiode 400 that has the diffusion region 461, and the source material is expected to diffuse into the diffusion region 461. In some embodiments, more than one substrate 520' can be simultaneously disposed on the susceptor 530' to increase the throughput of the diffusion process. It is noted that the geometry of the diffusion path can be changed according to the property of the diffusion source and the arrangement of the diffusion chamber.

Usually, when the diffusion distance is long, the vapor particles may travel randomly inside the vacuum chamber before reaching to the substrate. Unnecessary random travel of vapor particles increases the chance for the particles to collide with each other or collide with the sidewall of the chamber, which may adversely affect the uniformity control of the diffusion process. It is noted that the distance between the source to the substrate can range from millimeters to centimeters, as well as the distance between the controlling unit to the substrate. Also, controlling the volume of the diffusion chamber can also improve the uniformity of the vapor particles in the diffusion process.

Figure 6:
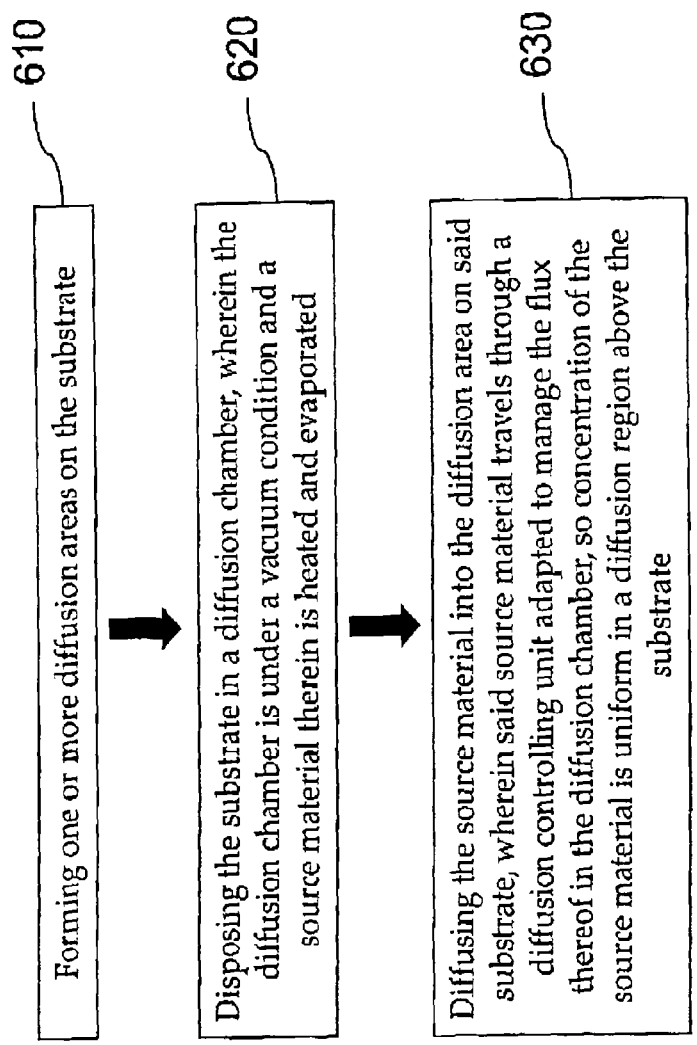
FIG. 6 illustrates a flow chart of a method for diffusing source material into a semiconductor substrate.

In another aspect shown in FIG. 6, a method for processing a substrate comprising steps of forming one or more diffusion areas on the substrate 610; disposing the substrate in a diffusion chamber, wherein the diffusion chamber is under a vacuum condition and a source material therein is heated and evaporated 620; and diffusing the source material into the diffusion area on said substrate, wherein said source material travels through a diffusion controlling unit adapted to manage the flux thereof in the diffusion chamber, so concentration of the source material is uniform in a diffusion region above the substrate 630.

In step 630, the diffusion controlling unit (540, 540') may include a plurality of diffusion paths (541, 541'), and the size of an opening of the diffusion path ranges from a few micrometers to a few hundred nanometers, and the distance between the controlling unit to the substrate ranges from millimeters to centimeters. Also, as shown in FIGS. 5a and 5b, some vapor particles may be blocked by the diffusion controlling unit (540, 540'), while some pass through the diffusion paths (541, 541') to form the diffusion region with uniform concentration of the vapor particle before diffusing into the substrate. In one embodiment, the substrate is a photodiode.

Having described the invention by the description and illustrations above, it should be understood that these are exemplary of the invention and are not to be considered as limiting. Accordingly, the invention is not to be considered as limited by the foregoing description, but includes any equivalent.

What is claimed is:

1. A diffusion chamber used in semiconductor manufacturing process comprising:
   a source material;
   a substrate attached to a susceptor, wherein said substrate has one or more diffusion areas that are doped by the source material; and
   a diffusion controlling unit including a plurality of blocks that include a plurality of diffusion paths, wherein each diffusion path is defined by two immediately adjacent parallel sides on two adjacent blocks,
   wherein said diffusion chamber is under a vacuum condition where the source material is heated and evaporated, and travels through the diffusion paths of the diffusion controlling unit that is adapted to manage the flux of the source material to enhance uniformity of the source material's concentration in a diffusion region above the substrate,
   wherein a bottom portion of each blocks collectively defines a reference horizontal line, and said parallel sides of each diffusion paths are angled at less than ninety (90) degrees with respect to said reference horizontal line.

2. The diffusion chamber of claim 1, wherein material of the substrate includes InP, Si, or Ge.

3. The diffusion chamber of claim 1, wherein the substrate is a photodiode.

4. The diffusion chamber of claim 3, wherein the photodiode includes a charge layer and a multiplication layer.

5. The diffusion chamber of claim 1, wherein the source material includes an element of Zinc or Cadmium.

6. A method for processing a substrate comprising steps of:
   forming one or more diffusion areas on said substrate;
   disposing the substrate in a diffusion chamber, wherein the diffusion chamber is under a vacuum condition and a source material therein is heated and evaporated; and
   diffusing the source material into the diffusion area on said substrate, wherein said source material travels through a diffusion controlling unit including a plurality of blocks that include a plurality of diffusion paths, wherein each diffusion path is defined by two immediately adjacent parallel sides on two adjacent blocks to manage the flux of the source material in the diffusion chamber to enhance uniformity of the source material's concentration in a diffusion region above the substrate,
   wherein a bottom portion of each blocks collectively defines a reference horizontal line, and said parallel sides of each diffusion paths are angled at less than ninety (90) degrees with respect to said reference horizontal line.

7. The method for processing a substrate of claim 6, wherein the step of forming one or more diffusion areas on the substrate comprises a step of preparing one or more masks to define the diffusion area(s).

8. The method for processing a substrate of claim 6, further comprising a step of annealing the substrate.

9. The method for processing a substrate of claim 6, wherein more than one substrate is allowed to be disposed in the diffusion chamber.

10. A method for diffusing impurities into a semiconductor substrate in a diffusion chamber that has a diffusion controlling unit, comprising steps of:
    forming one or more diffusion areas on said semiconductor substrate;
    disposing the semiconductor substrate in the diffusion chamber, wherein the diffusion chamber is under a vacuum condition and the impurities therein are heated and evaporated; and
    diffusing the impurities into the diffusion area on said semiconductor substrate, wherein said impurities travels through a diffusion controlling unit including a plurality of blocks that include a plurality of diffusion paths, wherein each diffusion path is defined by two immediately adjacent parallel sides on two adjacent blocks to manage the flux of the impurities to enhance uniformity of the concentration of the impurities in a diffusion region above the substrate,
    wherein a bottom portion of each blocks collectively defines a reference horizontal line, and said parallel sides of each diffusion paths are angled at less than ninety (90) degrees with respect to said reference horizontal line.

11. The method for diffusing impurities into a semiconductor substrate of claim 10, wherein the step of forming one or more diffusion areas on the substrate comprises a step of preparing one or more masks to define the diffusion area(s) on the substrate.

12. The method for diffusing impurities into a semiconductor substrate of claim 10, wherein the semiconductor substrate is InP, Si, or Ge.

13. The method for diffusing impurities into a semiconductor substrate of claim 10, wherein the semiconductor substrate is a photodiode.

14. The method for diffusing impurities into a semiconductor substrate of claim 10, wherein the impurities include an element of Zinc or Cadmium.

* * * * *